(12) United States Patent
Fang et al.

(10) Patent No.: US 8,398,778 B2
(45) Date of Patent: Mar. 19, 2013

(54) CONTROL OF BEVEL ETCH FILM PROFILE USING PLASMA EXCLUSION ZONE RINGS LARGER THAN THE WAFER DIAMETER

(75) Inventors: Tong Fang, Fremont, CA (US);
Yunsang Kim, Monte Sereno, CA (US);
Keechan Kim, Pleasanton, CA (US);
George Stojakovic, Wappingers Falls, NY (US)

(73) Assignee: Lam Research Corporation, Fremont, CA (US)

( * ) Notice: Subject to any disclaimer, the term of this patent is extended or adjusted under 35 U.S.C. 154(b) by 1297 days.

(21) Appl. No.: 12/076,257

(22) Filed: Mar. 14, 2008

(65) Prior Publication Data
US 2008/0227301 A1   Sep. 18, 2008

Related U.S. Application Data

(63) Continuation-in-part of application No. 11/698,190, filed on Jan. 26, 2007.

(51) Int. Cl.
*B08B 6/00* (2006.01)
*C25F 1/00* (2006.01)
*C25F 3/30* (2006.01)
*C25F 5/00* (2006.01)

(52) U.S. Cl. ....... 134/1.2; 134/1.1; 134/115 R; 134/902; 438/706; 257/E21.218

(58) Field of Classification Search .................. 134/1.2, 134/115 R, 1.1; 438/706; 257/E21.218
See application file for complete search history.

(56) References Cited

U.S. PATENT DOCUMENTS

| | | | | |
|---|---|---|---|---|
| 5,945,351 A | * | 8/1999 | Mathuni | 438/706 |
| 6,004,631 A | * | 12/1999 | Mori | 427/534 |
| 6,406,589 B1 | * | 6/2002 | Yanagisawa | 156/345.3 |
| 6,837,967 B1 | * | 1/2005 | Berman et al. | 156/345.3 |
| 7,183,181 B2 | | 2/2007 | Li et al. | |
| 7,197,178 B2 | | 3/2007 | Simpkins | |
| 7,208,326 B2 | * | 4/2007 | Rennie et al. | 438/9 |
| 7,217,662 B2 | | 5/2007 | Toyota et al. | |
| 7,229,504 B2 | | 6/2007 | Sugarman et al. | |
| 7,303,462 B2 | | 12/2007 | Duboust et al. | |
| 7,303,463 B2 | | 12/2007 | Kubo | |
| 7,312,880 B2 | | 12/2007 | Whitefield et al. | |
| 7,328,713 B2 | | 2/2008 | Kim | |

(Continued)

FOREIGN PATENT DOCUMENTS

KR   10-2007-0066934 A   6/2007

OTHER PUBLICATIONS

U.S. Appl. No. 11/698,186, filed Jan. 26, 2007.

(Continued)

*Primary Examiner* — Michael Kornakov
*Assistant Examiner* — Katelyn Whatley
(74) *Attorney, Agent, or Firm* — Buchanan Ingersoll & Rooney PC

(57) ABSTRACT

A method of cleaning a bevel edge of a semiconductor substrate is provided. A semiconductor substrate is placed on a substrate support in a reaction chamber of a plasma processing apparatus. The substrate has a dielectric layer overlying a top surface and a bevel edge of the substrate, the layer extending above and below an apex of the bevel edge. A process gas is introduced into the reaction chamber and energized into a plasma. The bevel edge is cleaned with the plasma so as to remove the layer below the apex without removing all of the layer above the apex.

11 Claims, 12 Drawing Sheets

U.S. PATENT DOCUMENTS

| | | | |
|---|---|---|---|
| 7,399,979 | B2 | 7/2008 | Nagasaka |
| 7,552,736 | B2 * | 6/2009 | Collins et al. .................. 134/1.1 |
| 7,858,898 | B2 | 12/2010 | Bailey, III et al. |
| 8,123,901 | B2 | 2/2012 | Inada et al. |
| 2004/0137745 | A1 * | 7/2004 | Houghton et al. ............ 438/706 |
| 2004/0238488 | A1 * | 12/2004 | Choi et al. ...................... 216/58 |
| 2005/0173067 | A1 * | 8/2005 | Lim ........................ 156/345.32 |
| 2005/0263484 | A1 * | 12/2005 | Park et al. ....................... 216/59 |
| 2005/0284568 | A1 * | 12/2005 | America et al. ........... 156/345.5 |
| 2006/0051967 | A1 * | 3/2006 | Chang et al. ................. 438/710 |
| 2007/0026670 | A1 | 2/2007 | Schuehrer et al. |
| 2007/0029044 | A1 * | 2/2007 | Jeon .......................... 156/345.3 |
| 2007/0068900 | A1 * | 3/2007 | Kim et al. ....................... 216/67 |
| 2007/0155133 | A1 | 7/2007 | Richter et al. |
| 2007/0186855 | A1 | 8/2007 | Dhindsa |
| 2007/0199658 | A1 | 8/2007 | Dhindsa et al. |
| 2007/0251919 | A1 * | 11/2007 | Imai ................................ 216/58 |
| 2008/0050923 | A1 | 2/2008 | Kim et al. |
| 2009/0114244 | A1 | 5/2009 | Sexton et al. |
| 2009/0170334 | A1 | 7/2009 | Fang et al. |
| 2009/0188627 | A1 | 7/2009 | Fang et al. |

OTHER PUBLICATIONS

U.S. Appl. No. 11/698,191, filed Jan. 26, 2007.
U.S. Appl. No. 61/009,142, filed Dec. 27, 2007.
U.S. Appl. No. 12/021,177, filed Jan. 28, 2008.
U.S. Appl. No. 11/758,576, filed Jun. 5, 2007.
Official Action issued Apr. 22, 2010 for Chinese Appln. No. 200880003211.3.
International Search Report and Written Opinion mailed Sep. 24, 2009 for PCT/US2009/001506.
Official Action mailed Apr. 13, 2012 for Japanese Patent Appln. No. 2009-547292.

* cited by examiner

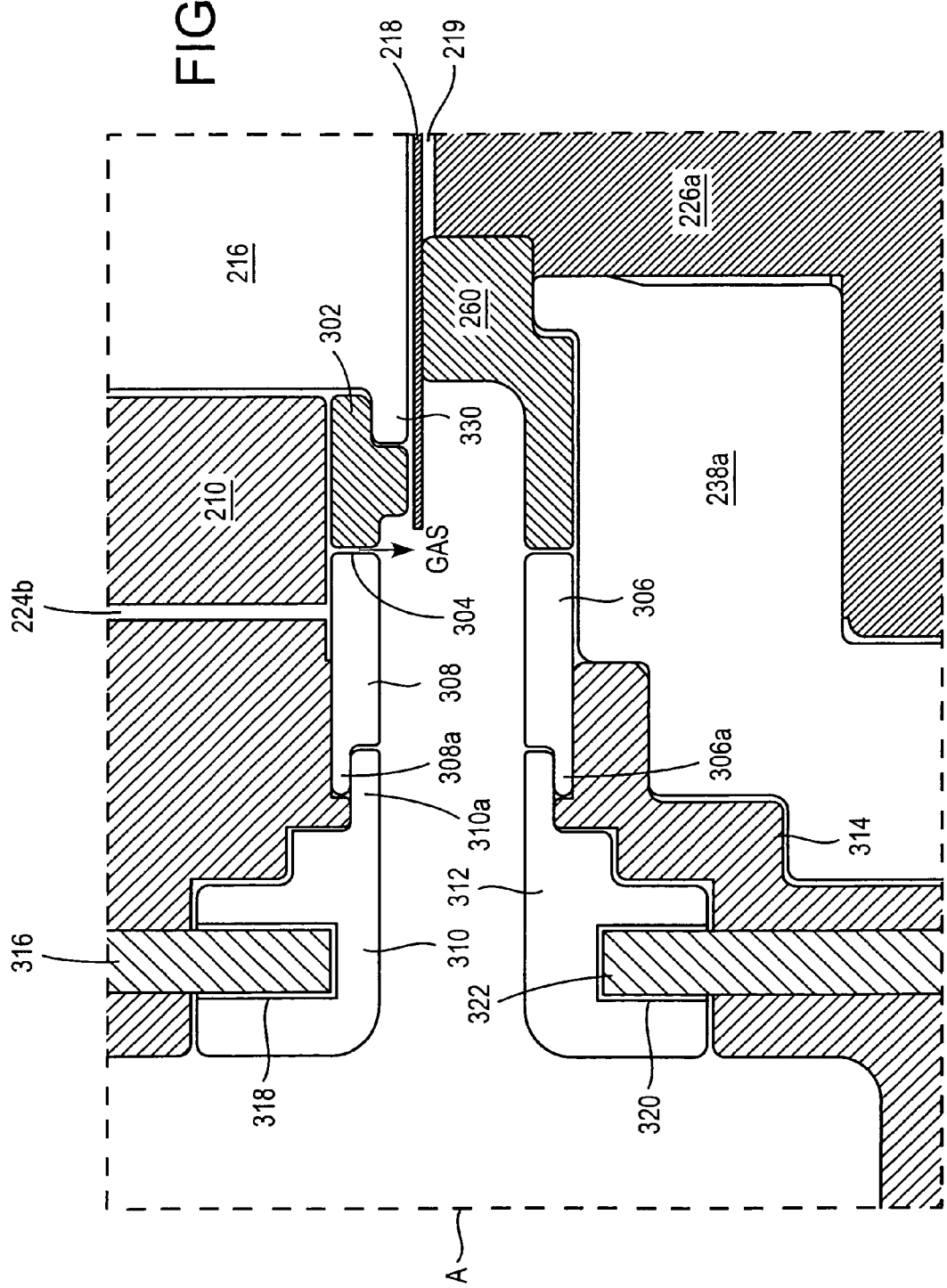

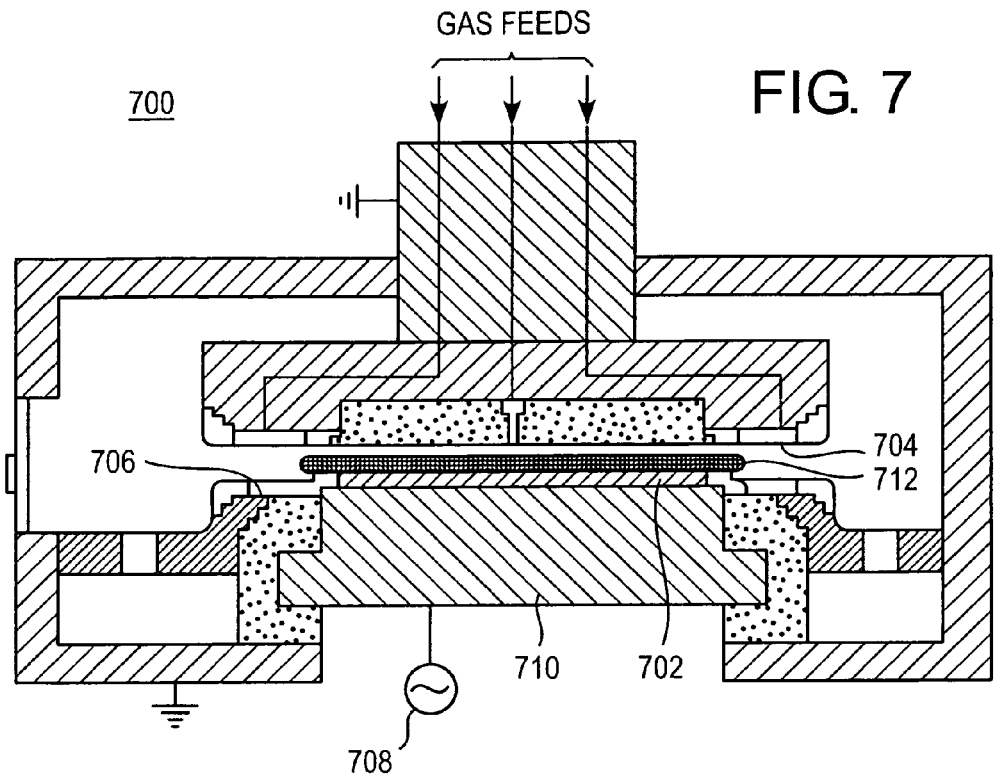
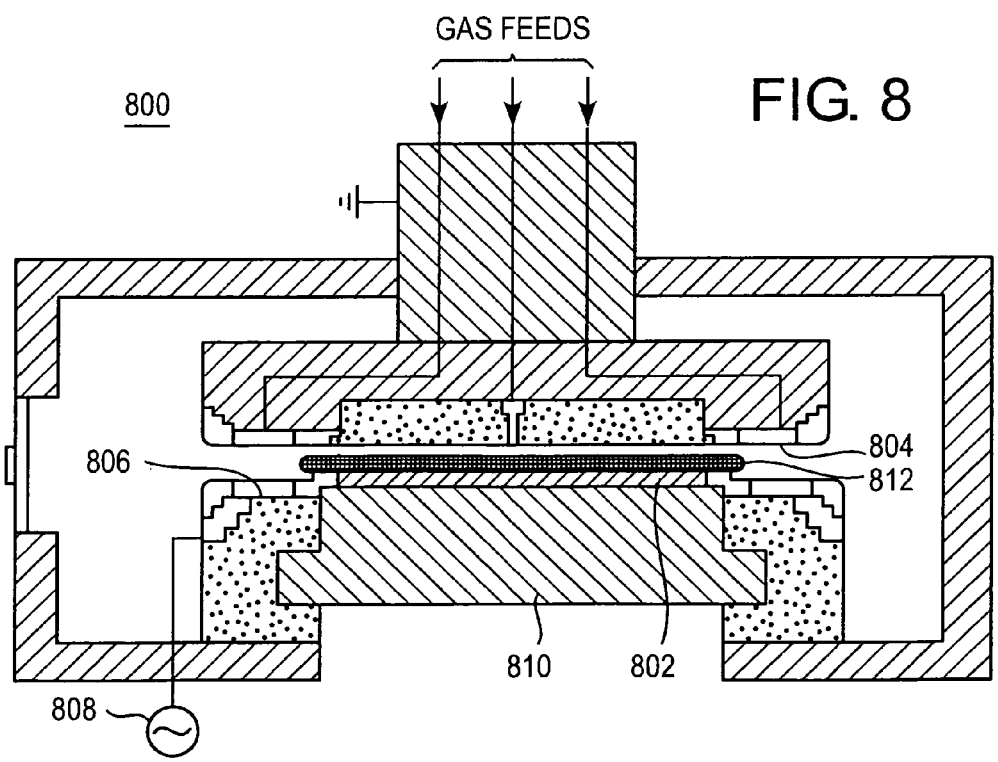

CONTROL OF BEVEL ETCH FILM PROFILE USING PLASMA EXCLUSION ZONE RINGS LARGER THAN THE WAFER DIAMETER

CROSS-REFERENCE TO RELATED APPLICATIONS

This is a continuation-in-part of co-pending prior U.S. application Ser. No. 11/698,190, filed Jan. 26, 2007, which is hereby incorporated by reference.

BACKGROUND

Integrated circuits are formed from a wafer or substrate over which are formed patterned microelectronics layers. In the processing of the substrate, plasma is often employed to etch intended portions of films deposited on the substrate. Typically, etch plasma density is lower near the edge of the substrate, which may result in accumulation of a poly-silicon layer, a nitride layer, a metal layer, etc. (collectively referred to as byproduct layer) on the top and bottom surfaces of the substrate bevel edge. As successive byproduct layers are deposited on the top and bottom surfaces of the substrate bevel edge as a result of several different etch processes, the bonds between the byproduct layers and the substrate will eventually weaken and the byproduct layers may peel or flake off, often onto other substrates during substrate transport thereby contaminate the other substrates.

SUMMARY

In one embodiment, a method of cleaning a bevel edge of a semiconductor substrate is provided. A semiconductor substrate is placed on a substrate support in a reaction chamber of a plasma processing apparatus. The substrate has a dielectric layer overlying a top surface and a bevel edge of the substrate, the layer extending above and below an apex of the bevel edge. A process gas is introduced into the reaction chamber and energized into a plasma. The bevel edge is cleaned with the plasma so as to remove the layer below the apex without removing all of the layer above the apex.

In another embodiment, a bevel etcher wherein a bevel edge of a semiconductor wafer is subjected to plasma cleaning is provided. A lower support has a cylindrical top portion. A lower plasma-exclusion-zone (PEZ) ring is supported on the top portion of the lower support. The lower PEZ ring has an upper surface on which the wafer is supported. An upper dielectric component is disposed above the lower support and has a cylindrical bottom portion opposing the top portion of the lower support. An upper PEZ ring surrounds the bottom portion of the dielectric component and opposes the lower PEZ ring, an annular space between the lower and upper PEZ rings limiting the extent of the bevel edge to be cleaned by the plasma. At least one radio frequency (RF) power source is adapted to energize process gas into the plasma during a cleaning operation. The lower and upper PEZ rings are adapted to respectively shield the lower support and the upper dielectric component from the plasma during the cleaning operation. A portion of the upper PEZ ring closest to the wafer has an outer diameter at least equal to an outer diameter of the wafer.

In another embodiment, a configurable part of a bevel etcher is provided. A bevel edge of a semiconductor wafer is subjected to plasma cleaning, the bevel etcher including a lower electrode assembly on which the wafer is supported during the bevel cleaning operation, an upper electrode assembly including a dielectric plate facing the lower support and attached to an upper support which is movable vertically to position the dielectric plate at a small distance from the upper surface of the wafer. The upper electrode assembly includes at least one gas passage through which gas can be flowed in the vicinity of the bevel edge during the bevel cleaning operation. The dielectric plate has at least one gas passage through which gas can be flowed over the surface of the wafer during the bevel cleaning operation. The configurable part comprising an upper PEZ ring of electrically conductive, semiconductive or dielectric material adapted to shield the upper dielectric plate from the plasma during the cleaning operation. A portion of the upper PEZ ring closest to the wafer has an outer diameter which is greater than the outer diameter of the wafer.

BRIEF DESCRIPTION OF FIGURES

FIG. 3 shows an enlarged schematic diagram of region A in FIG. 2.

FIG. 7 shows a schematic cross sectional diagram of a bevel etcher in accordance with a further embodiment.

FIG. 8 shows a schematic cross sectional diagram of a bevel etcher in accordance with another further embodiment.

DETAILED DESCRIPTION

Figure 1:
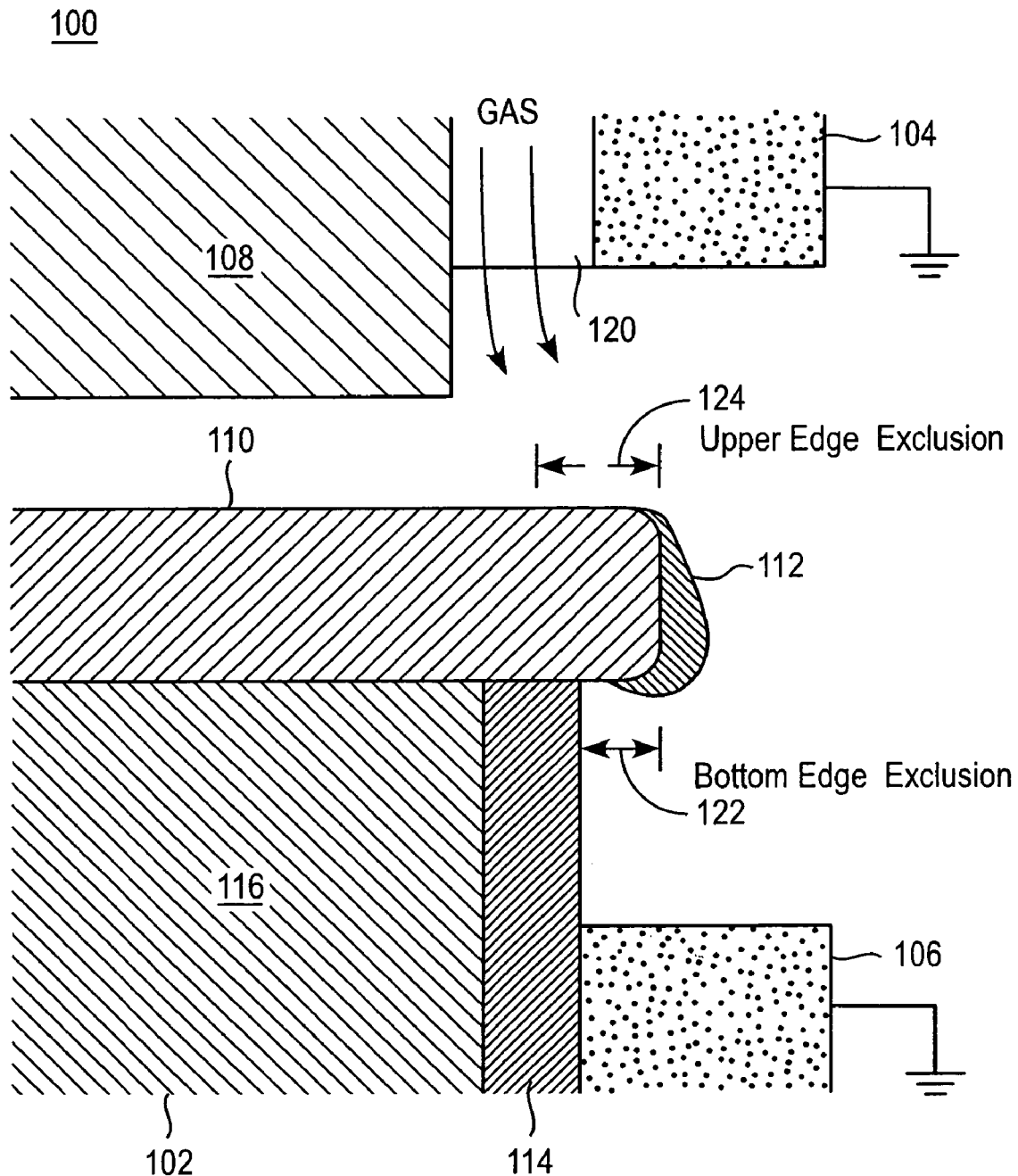
FIG. 1 shows a schematic cross sectional diagram of a bevel etching chamber.

FIG. 1 shows a schematic cross sectional diagram of a bevel etching chamber 100 for etching the bevel edge of a substrate 110. As depicted, the chamber 100 includes a cathode 102 coupled to an RF power source; a stage 116 for supporting a substrate 110; an insulating material 114 surrounding the stage 116; top and bottom ring-shaped electrodes 104, 106; and a top insulator 108. The reaction gas is blown through one or more gas outlets 120 and energized into plasma to clean the byproduct layers 112 formed on the bevel edge of the substrate 110. The etching chamber 100 may have several difficulties in controlling the area to be cleaned. For instance, to change the size of a bottom edge exclusion 122, it may be necessary to change the thickness of the insulating material 114 and, as a consequence, the shape and/or location of the bottom ring-shaped electrode 106 may need to be changed. In some cases, the diameter of the entire stage 116 may need to be changed, which may result in an increase in the Cost-of-Consumables (CoC). Another drawback is that the chamber 100 does not have a mechanism to accurately control the extent of a top edge exclusion 124. To change the extent of the top edge exclusion 124, it may be necessary to change the outer diameter of the insulator 108 as well as the locations of the gas outlet(s) 120 and top ring-shaped electrode 104. As such, it may be costly to accurately control the extent of edge exclusions in such etching chambers.

Figure 2:
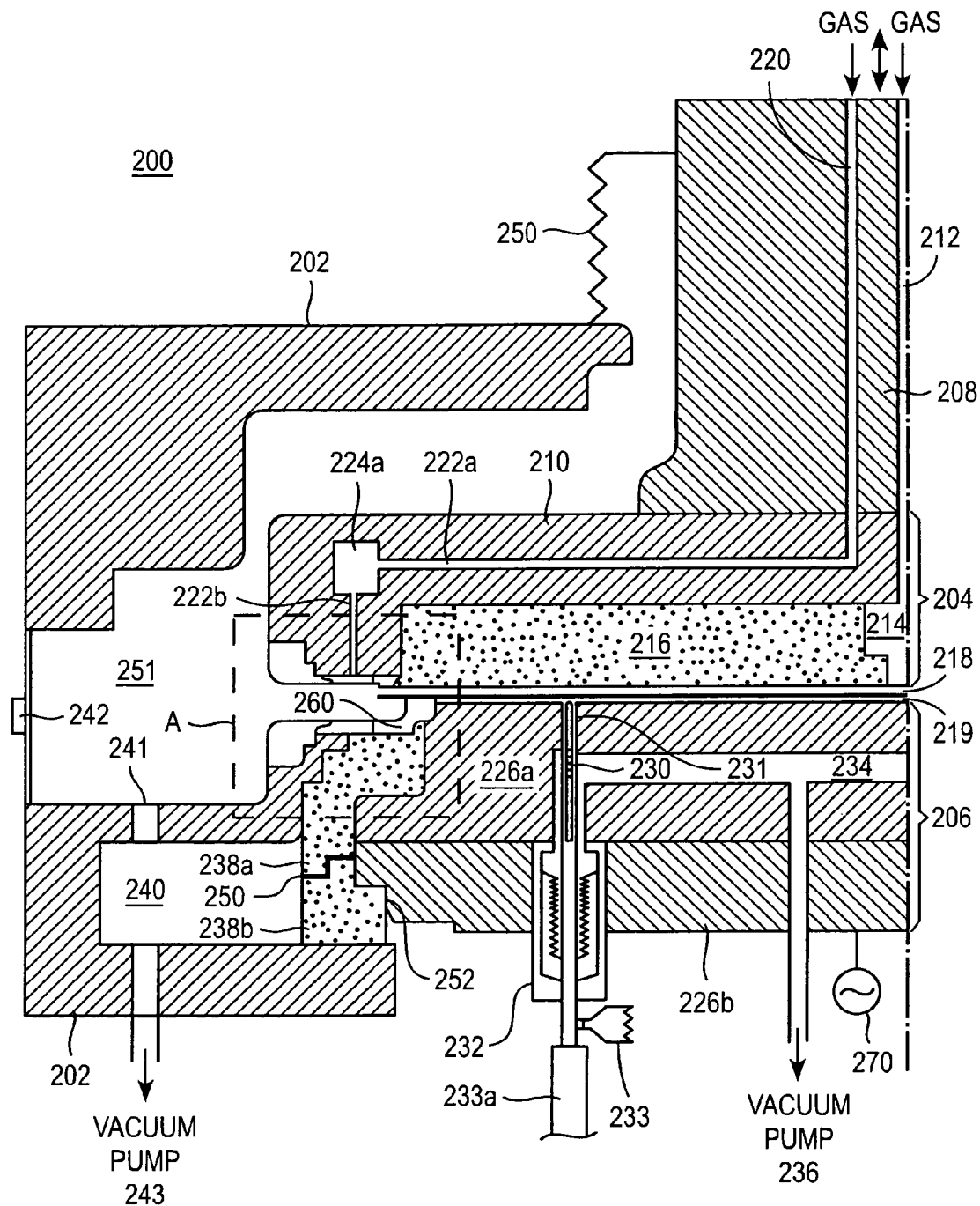
FIG. 2 shows a schematic cross sectional diagram of a bevel etcher in accordance with one embodiment.

Referring now to FIG. 2, there is shown a schematic cross sectional diagram of a substrate etching system or bevel etcher 200 for cleaning the bevel edge of a substrate 218 in accordance with one embodiment. The bevel etcher 200 has a generally, but not limited to, axisymmetric shape and, for brevity, only half of the side cross sectional view is shown in FIG. 2. As depicted, the bevel etcher 200 includes: a chamber wall 202 having a door or gate 242 for through which the substrate 218 is loaded/unloaded; an upper electrode assembly 204; a support 208 from which the upper electrode assembly 204 is suspended; and a lower electrode assembly 206. The support 208 moves the upper electrode assembly 204 up and down (in the direction of the double arrow) for loading/unloading the substrate 218. A precision driving mechanism (not shown in FIG. 2) is attached to the support 208 so that the gap between the upper electrode assembly 204 and the substrate 218 is controlled accurately.

Metal bellows 250 are used to form a vacuum seal between the chamber wall 202 and support 208 while allowing the support 208 to have a vertical motion relative to the wall 202. The support 208 has a center gas feed (passage) 212 and an edge gas feed (passage) 220. The gas feeds 212, 220 provide process gas to be energized into plasma to clean the bevel edge. During operation, the plasma is formed around the bevel edge of the substrate 218 and has a generally ring shape. To prevent the plasma from reaching the central portion of the substrate 218, the space between an insulator plate 226 on the upper electrode and the substrate is small and the process gas is fed from the center feed, preferably through a stepped hole 214. Then, the gas passes through the gap between the upper electrode assembly 204 and the substrate 218 in the radial direction of the substrate. Each gas feed is used to provide the same process gas or other gases, such as buffer gas and/or purge gas. For instance, the buffer gas can be injected through the center gas feed 212, while the process gas can be injected through the edge gas feed 220. The plasma/process gas is withdrawn from the chamber space 251 to the bottom space 240 via a plurality of holes (outlets) 241. During a bevel cleaning operation, the chamber pressure is typically in the range of 500 mTorr to 2 Torr, e.g., a vacuum pump 243 can be used to evacuate the bottom space 240 during a cleaning operation.

The upper electrode assembly 204 includes: an upper dielectric plate or upper dielectric component 216; and an upper metal component 210 secured to the support 208 by a suitable fastening mechanism and grounded via the support 208. The upper metal component 210 is formed of a metal, such as aluminum, and may be anodized. The upper metal component 210 has one or more edge gas passageways or through holes 222a, 222b and an edge gas plenum 224, wherein the edge gas passageways 222 are coupled to the edge gas feed 220 for fluid communication during operation.

The upper dielectric plate 216 is attached to the upper metal component 210 and formed of a dielectric material, preferably, but not limited to, ceramic. If desired, the upper dielectric plate 216 may have a coating of $Y_2O_3$. Typically, it is difficult to drill a deep straight hole in some ceramics, such as $Al_2O_3$, and therefore a stepped hole 214 can be used instead of a deep straight hole. While the upper dielectric plate 216 is shown with a single center hole, the upper dielectric plate 216 may have any suitable number of outlets, e.g., the outlets can be arranged in a showerhead hole pattern if desired.

The lower electrode assembly 206 includes: powered electrode 226 having an upper portion 226a and a lower portion 226b and operative to function as a vacuum chuck to hold the substrate 218 in place during operation; lift pins 230 for moving the substrate 218 up and down; a pin operating unit 232; bottom dielectric ring 238 having an upper portion 238a and a lower portion 238b. Hereinafter, the term powered electrode refers to one or both of the upper and lower portions 226a, 226b. Likewise, the term bottom dielectric ring 238 refers to one or both of the upper and lower portions 238a, 238b. The powered electrode 226 is coupled to a radio frequency (RF) power source 270 to receive RF power during operation.

The lift pins 230 move vertically within cylindrical holes or paths 231 and are moved between upper and lower positions by the pin operating unit 232 positioned in the powered electrode 226. The pin operating unit includes a housing around each lift pin to maintain a vacuum sealed environment around the pins. The pin operating unit 232 includes any suitable lift pin mechanism, such as a robot arm 233 (e.g., a horizontal arm having segments extending into each housing and attached to each pin) and an arm actuating device (not shown in FIG. 2). For brevity, only a tip portion of a segment of the robot arm is shown in FIG. 2. While three or four lift pins can be used to lift a wafer such as a 30 mm wafer, any suitable number of pins 230 may be used in the bevel etcher 200. Also, any suitable mechanisms, such as lifter bellows, can be used as the pin operating unit 232.

According to a preferred embodiment, the pin lifter is a multi-position pin lifter which can move the lift pins 230 to various positions. For example, the lift pins 230 can be moved vertically to four positions via the lift pin operating unit 232 as follows: (1) in the first position the pins 230 are moved to locate upper ends thereof below the top surface of the bottom electrode 226a, (2) in the second position the pins 230 are moved to locate upper ends thereof in contact with the lower surface of a fixture installed with its bottom surface in the same plane as a wafer supported on the ring 260 and this position is monitored via a position sensor 233a which outputs a signal to a controller to record the position as a "zero" position, (3) in the third position the pins 230 are moved to locate upper ends thereof in contact with the dielectric plate 216 and this position is monitored via the position sensor 233a which outputs a signal to the controller to determine gap and planarity information without having to open the chamber, and (4) in the fourth position the pins 230 are moved to their full up position to allow transfer of a wafer to be cleaned into the chamber or transfer of a cleaned wafer out of the chamber.

For minimizing costs of manufacture, the lift pins are preferably moved by a common lift device such as an air cylinder or motor. In such case, the gap distance could be determined when a pin contacts the dielectric plate on the upper electrode assembly. For planarity measurement, each pin could be provided with some compliance relative to the common lifting yoke, e.g., each pin could be spring loaded to allow movement of each pin relative to the other pins and an individual sensor associated with each pin could output information corresponding to an individual pin's position. By moving all of the pins into contact with the dielectric plate, if the dielectric plate is not parallel with the substrate support surface, the vertical offset of each pin relative to the other pins measured by the lift pin sensors could be used to determine the degree of out of planarity of the upper electrode assembly. Preferably, the spring load on each lift pin is sufficient to support the weight of a wafer, i.e., the springs supporting the lift pins would not be compressed under the weight of the wafer so that during wafer transfer the lift pins are at the same height relative to each other. Alternatively, the pins could have independent drives.

The substrate 218 is mounted on a lower configurable plasma-exclusion-zone (PEZ) ring 260, wherein the term PEZ refers to a radial distance from the center of the substrate to the outer edge of the area where the plasma for cleaning the bevel edge is excluded. The top surface of the powered electrode 226, the bottom surface of the substrate 218, and inner periphery of the lower configurable PEZ ring 260 form an enclosed vacuum region recess (vacuum region) 219 in fluid communication with a vacuum source such as a vacuum pump 236. The cylindrical holes or paths for the lift pins 230 are also shared as gas passageways, through which the vacuum pump 236 evacuates the vacuum region 219 during operation. The powered electrode 226 includes a plenum 234 to reduce temporal pressure fluctuations in the vacuum region 219 and, in cases where multiple lift pins are used, to provide a uniform suction rate for the cylindrical holes.

On the top surface of the substrate 218 are integrated circuits formed by a series of processes. One or more of the processes may be performed by use of plasma that may transfer heat energy to the substrate, developing thermal stress on the substrate and thereby causing wafer bowing. During a bevel cleaning operation, the substrate bowing can be reduced by use of a pressure difference between the top and bottom surfaces of the substrate 218. The pressure in the vacuum region 219 is maintained under vacuum during operation by a vacuum pump 236 coupled to the plenum 234. By adjusting the gap between the upper dielectric plate 216 and the top surface of the substrate 218, the gas pressure in the gap can be varied without changing the overall flow rate of the process gas(es). Thus, by controlling the gas pressure in the gap, the pressure difference between the top and bottom surfaces of the substrate 218 can be varied and thereby the bending force applied on the substrate 218 can be controlled.

The bottom dielectric ring 238 is formed of a dielectric material, such as ceramic including $Al_2O_3$, and electrically separates the powered electrode 226 from the chamber wall 202. The lower portion 238b of the bottom dielectric ring preferably has a step 252 formed on the inner periphery of its upper surface to mate with a recess on a lower edge of the powered electrode 226. The lower portion 238b preferably has a step 250 formed on its outer periphery to mate with a stepped surface on the upper portion 238a of the bottom dielectric ring, referred to as a focus ring. The steps 250, 252 align the bottom dielectric ring 238 with the powered electrode 226. The step 250 also forms a tortuous gap along the surface thereof to eliminate the direct line-of-sight between the powered electrode 226 and the chamber wall 202 thereby reducing the possibility of a secondary plasma strike between the powered electrode 226 and the chamber wall 202.

FIG. 3 shows an enlarged schematic diagram of region A in FIG. 2. As depicted, the upper electrode assembly 204 includes three concentrically positioned rings: an upper configurable PEZ ring 302; an upper electrode ring 308; and an outer upper dielectric ring 310. The gap 304 between the upper configurable PEZ ring 302 and the upper electrode ring 308 forms a tortuous gas passageway connected to the edge gas passageway 224b. The tortuous gap 304 prevents the edge gas passageway 224b from being directly exposed to plasma thereby preventing formation of secondary plasma or plasma light-up within the edge gas passageway 224b. Such secondary plasma could erode the inner wall of the edge gas passageway 224b and result in need of frequent replacements of the upper metal component 210 as well as introduce eroded material to the substrate 218.

Figure 4A:
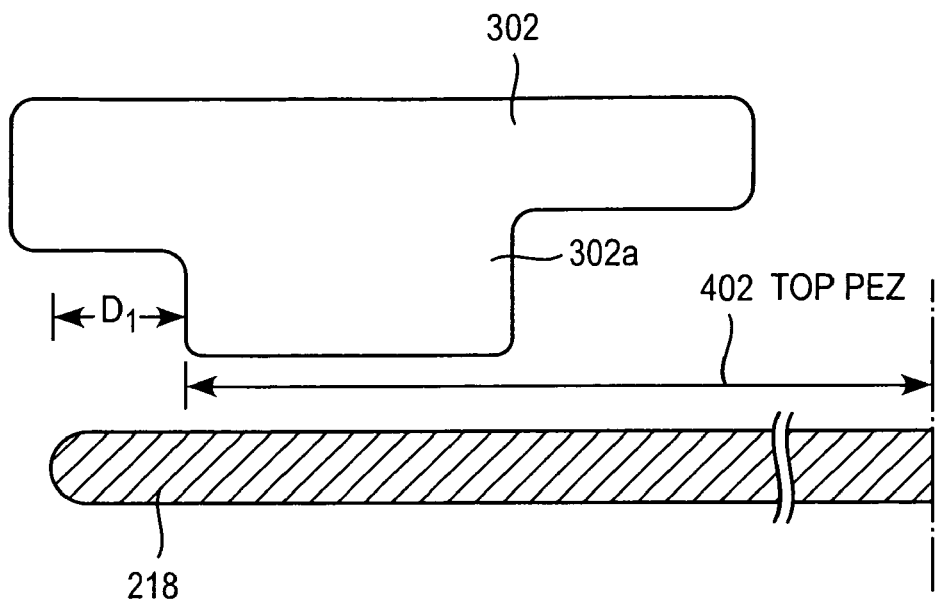
FIGS. 4A-4B show schematic cross sectional diagrams of the configurable plasma exclusion zone (PEZ) rings in FIG. 2.

The upper configurable PEZ ring 302 has two steps or recesses respectively formed on its inner and outer lower edges, wherein the step on the inner lower edge engages a flange 330 of the upper dielectric plate 216 to clamp the ring 302 against metal component 210. The upper configurable PEZ ring 302 can have various configurations to provide different top plasma exclusion zones (top PEZ). FIG. 4A shows an enlarged schematic cross sectional view of the upper configurable PEZ ring 302 shown in FIG. 3, wherein the distance $D_1$ is referred to as top edge exclusion zone and varies with changes in width of lower portion 302a of the ring 302. The configuration of the PEZ ring 302 thus determines the top PEZ 402 that is equal to the radius of the substrate 218 minus the distance $D_1$. The upper configurable PEZ ring 302 also needs to be replaced more frequently than the other parts of the upper electrode assembly 204 due to plasma erosion and is considered a consumable component. Typically, process gases may include an oxygen-containing gas, such as $O_2$. Small amounts, such as <10%, of a fluorine-containing gas, such as $CF_4$, $SF_6$, or $C_2F_6$, may also be added to clean the bevel edge. Plasma containing these reactive gases may erode the upper PEZ ring 302, and thereby necessitate periodic replacement of the upper configurable PEZ ring 302. For easy access to the upper configurable PEZ ring 302 during replacement, the upper configurable PEZ ring 302 is held in place by the upper dielectric plate 216 and can be replaced without removing the upper electrode assembly 204 from the chamber wall 202. For example, removal of the plate 216 allows ring 302 to be replaced with a different ring having the same or different configuration.

The upper configurable PEZ ring 302 prevents the plasma from directly eroding the upper dielectric plate 216. The upper configurable PEZ ring 302 is formed of an electrically conductive, semiconductive or dielectric material, such as a ring entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$) or other materials or the support ring 124 can be a composite ring of metal, ceramic or polymer coated with a conductive or dielectric material such as Si, SiC or $Y_2O_3$, ceramic (preferably $Al_2O_3$), or pure material, such as CVD SiC (doped suitably to provide high resistivity), to reduce contamination of the substrate 218 during operation. To reduce the Cost-of-Consumables (CoC), the upper configurable PEZ ring 302 preferably has a small and simple cross section. In general, it is difficult to drill and tap threaded holes in some ceramics. Due to the clamping arrangement for holding the ring 302 in place, the upper configurable PEZ ring 302 does not require threaded holes for it to be secured to the upper dielectric plate 216 or to metal component 210, thus providing flexibility in selecting the material therefore. The upper configurable PEZ ring 302 may be formed of a material having a high electrical resistance, preferably, but not limited to, ~105 ohm-cm. As the electrical coupling between the powered electrode 226 and the upper electrode ring 308 is affected by the electrical properties of the upper configurable PEZ ring 302, the plasma characteristics in the vicinity of the bevel edge can be controlled by varying the material and/or configuration of the upper configurable PEZ ring 302.

The upper electrode ring 308 is connected to and grounded via the upper metal component 210. Instead of using threaded fastening mechanisms, such as bolts, the upper electrode ring 308 is preferably held in place by the clamping force of the outer upper dielectric ring 310. For example, electrode ring 308 can have a flange 308a which mates with flange 310a on the dielectric ring 310. As such, plasma contaminants that would otherwise originate from the erosion of the exposed fastening mechanisms can be obviated. The upper electrode ring 308 is preferably formed of a metal, such as anodized aluminum. In cases where a cleaner plasma is required, the upper electrode ring 308 can be formed of pure materials such as Si (single crystal or polycrystalline silicon), CVD low resistivity SiC or any suitable high-purity conductive materials. To minimize the cost impact of using high-purity materials, the cross sectional dimension of the upper electrode ring 308 is minimized. Although a bolt-through design could be used, a clamp-in-place design simplifies the configuration of the upper electrode ring 308 to thereby lower the CoC and allow the use of a wider range of materials for contamination control. It is also noted that the lower and upper electrode rings 306, 308 may be formed of graphite or various carbon based materials including SiN, BN, and AlN, for instance.

The outer upper dielectric ring 310 is formed of a dielectric material, such as $Al_2O_3$, and may be coated with $Y_2O_3$. The outer upper dielectric ring 310 includes circumferentially spaced apart threaded holes 318 in its upper surface to receive bolts 316 for securing the outer upper dielectric ring 310 to the upper metal component 210. The outer upper dielectric ring 310 includes a protrusion or step (flange) 310 that is used to clamp a flange 308a of the upper electrode ring 308 to the upper metal component 210. It is noted that each bolt 316 is screwed from the top side of the upper electrode assembly 204 so that the bolts are not exposed to and eroded by the plasma. The inner edge diameter of the outer upper dielectric ring 310 determines the outer diameter of the ring or donut shaped plasma.

The lower electrode assembly 206 includes a lower metal liner (collar) 314 which surrounds focus ring 238a and three concentrically positioned rings: a lower configurable PEZ ring 260; a lower electrode ring or hoop ring 306; and an outer lower dielectric ring 312. The lower configurable PEZ ring 260, lower electrode ring 306, and lower metal liner 314 are supported by the bottom dielectric ring or focus ring 238 (more specifically, the upper portion 238a of the bottom dielectric ring) and liner 314. The lower electrode ring 306 is clamped against an upper surface of the lower metal liner 314 by the outer lower dielectric ring 312, wherein the lower metal liner 314 is connected to the chamber wall 202 for grounding. The focus ring 238a electrically separates the lower electrode ring 306 from the upper portion 226a of the powered electrode.

The powered electrode 226 is preferably formed of a metal, such as anodized aluminum. If the powered electrode 226 is exposed to and eroded by the plasma in cases where high cleanness plasma is required, it would be desirable to use a high purity material for the electrode 226 to meet the cleanness requirement. Because the lower configurable PEZ ring 260 is designed to shield the powered electrode 226 from the plasma, the powered electrode 226 can be formed of lower purity metals or materials regardless of the cleanness requirement.

Figure 4B:
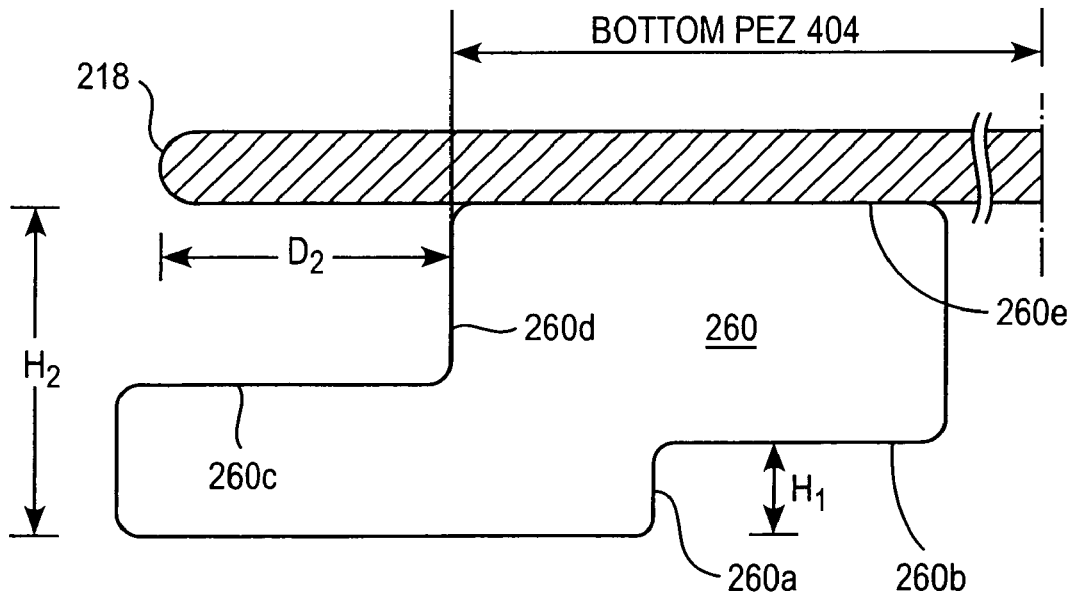

As shown in FIG. 4B, the lower configurable PEZ ring 260 has two recesses or steps respectively formed on its inner and outer edges, wherein the step formed by vertical surface 260a and the horizontal surface 260b on the lower inner edge mates with surfaces on the outer edge of the upper portion 226a of the powered electrode and a step formed by horizontal surface 260c and vertical surface 260d mate with surfaces on the focus ring 238a. The lower configurable PEZ ring 260 can be replaced with a PEZ ring providing a different sized bottom plasma exclusion zone. The distance $D_2$ formed by the second step is referred to as bottom edge exclusion zone and by varying the width of upper surface 260e it is possible to change the bottom PEZ 404 which is equal to the radius of the substrate 218 minus the distance $D_2$. Due to plasma erosion, the lower configurable PEZ ring 260 will be replaced more frequently than the other parts of the lower electrode assembly 206 and considered as a consumable component. Typically, process gases may include an oxygen-containing gas, such as $O_2$. Small amounts, such as <10%, of a fluorine-containing gas, such as $CF_4$, $SF_6$, or $C_2F_6$, may also be added to clean the bevel edge. Plasma containing these reactive gases may erode the lower configurable PEZ ring 260, necessitating periodic replacement of the lower configurable PEZ ring 260. For easy access to the lower configurable PEZ ring 260 during replacement, the lower configurable PEZ ring 260 is removably mounted on the steps of the upper portion 226a of the powered electrode and the focus ring 238a, and can be replaced without removing the lower electrode assembly 206 from the chamber wall 202.

As discussed above, the substrate 218 is mounted on the upper surface 206e (FIG. 4B) of the lower configurable PEZ ring 260. The heights $H_1$ and $H_2$ determine the vertical separation between the substrate 218 and powered electrode 226. For repeatable alignment therebetween, the heights $H_1$ and $H_2$ are preferably precisely controlled.

The lower configurable PEZ ring 260 protects the powered electrode 226 from attack by the plasma used to effect the bevel cleaning. The lower configurable PEZ ring 260 is formed of an electrically conductive, semiconductive or dielectric material, such as a ring entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$) or other materials or the support ring 124 can be a composite ring of metal, ceramic or polymer coated with a conductive or dielectric material such as Si, SiC or $Y_2O_3$, e.g., a ceramic (preferably $Al_2O_3$), or pure material, such as Si (single crystal or polycrystalline silicon), CVD high resistivity SiC or the like, to reduce contamination of the substrate 218 during a cleaning operation. In general, it is difficult to drill and tap threaded holes in some ceramics. The lower configurable PEZ ring 260 does not require threaded holes to be secured to the focus ring 238a, providing flexibility in selecting the material therefore. The lower configurable PEZ ring 260 may be also formed of a material having a high electrical resistance, preferably, but not limited to, ~105 ohm-cm. As the electrical coupling between the powered electrode 226 and the lower electrode ring 306 is affected by the electrical properties of the lower configurable PEZ ring 260, the plasma characteristics can be controlled by varying the material and/or configuration of the lower configurable PEZ ring 260.

The lower electrode ring 306 is connected to and grounded via the lower metal liner 314. Instead of using threaded fastening mechanisms, such as bolts, the lower electrode ring 306 is preferably held in place by the clamping force of the outer lower dielectric ring 312. For example, an outer flange 306a on the electrode ring 306 can be engaged with an inner flange 312a on the dielectric ring 312 whereby electrode ring 306 is clamped against the liner 314. As such, plasma contaminants that might otherwise originate from erosion of exposed fastening mechanisms can be obviated. The lower electrode ring 306 is preferably formed of a metal, such as anodized aluminum. In cases where a cleaner plasma is required, the lower electrode ring 306 may be formed of high purity materials such as pure Si (e.g., single crystal or polycrystalline silicon), CVD low resistivity SiC or any suitable high-purity conductive materials. To minimize the cost impact of using high-purity materials, the cross sectional dimensions of the lower electrode ring 306 can be minimized. Use of a clamp-in-place design simplifies the configuration of lower electrode ring 306 and thereby lowers the CoC through use of a wider range of materials for contamination control.

The outer lower dielectric ring 312 is formed of a dielectric material, such as $Al_2O_3$, and may be coated with $Y_2O_3$. The outer lower dielectric ring 312 includes a series of threaded holes 320 which receive bolts 322 for securing the outer lower dielectric ring 312 to the lower metal liner 314. As discussed above, the outer lower dielectric ring 312 includes a protrusion or step (flange) that is used to clamp the lower electrode ring 306 to the metal liner 314. It is noted that the bolts 322 are screwed from the bottom side of the lower electrode assembly 206 so that the bolts 322 are not exposed to and eroded by the plasma. The inner edge diameter of the outer lower dielectric ring 312 determines the outer diameter of the ring or donut shaped plasma.

Figure 5A:
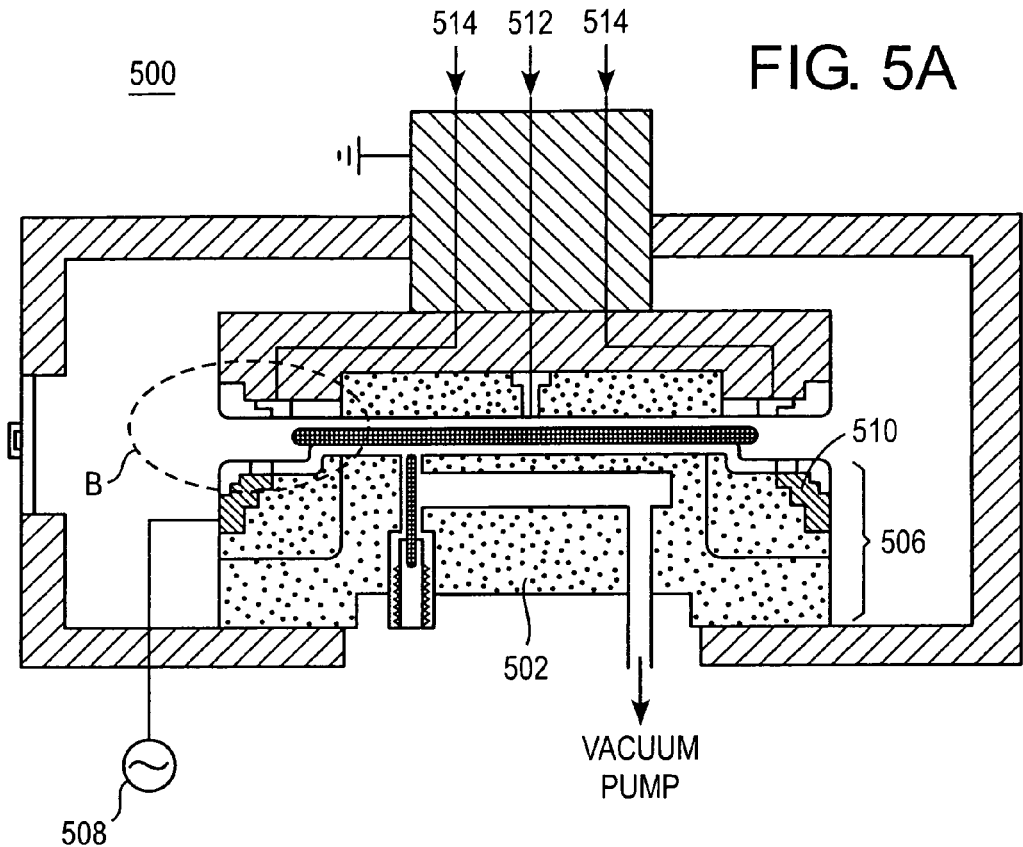
FIG. 5A shows a schematic cross sectional diagram of a bevel etcher in accordance with another embodiment.
Figure 5B:
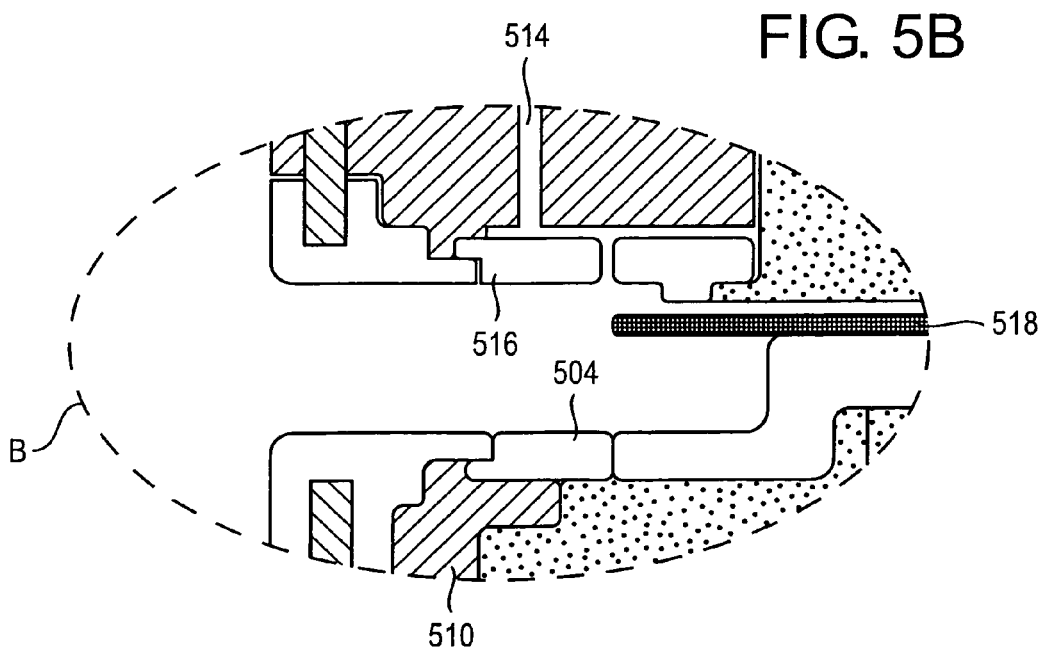
FIG. 5B shows an enlarged schematic diagram of region B in FIG. 5A.

FIG. 5A shows a schematic cross sectional diagram of a bevel etcher 500 in accordance with another embodiment. FIG. 5B shows an enlarged schematic diagram of region B in FIG. 5A. As depicted, the components of the bevel etcher 500 are quite similar to those shown in FIG. 2. The differences are that the lower electrode assembly 506 includes a lower support 502 in place of the powered electrode 226 and the lower electrode ring 504 is coupled to an RF power source 508 via the lower metal liner 510. The lower support 502 is formed of a dielectric material and operates as a vacuum chuck to hold the substrate 518 in place during a bevel cleaning operation.

During operation, the RF power source 508 provides RF power to energize process gas provided through at least one of the gas feeds 512, 514 into plasma, wherein the RF power is supplied in one or more frequencies in a range, but not limited to, of ~2 MHz to ~13 MHz. In a variation, the upper electrode ring 516 is coupled to an RF power source while the lower electrode ring 504 is grounded.

Figure 6:
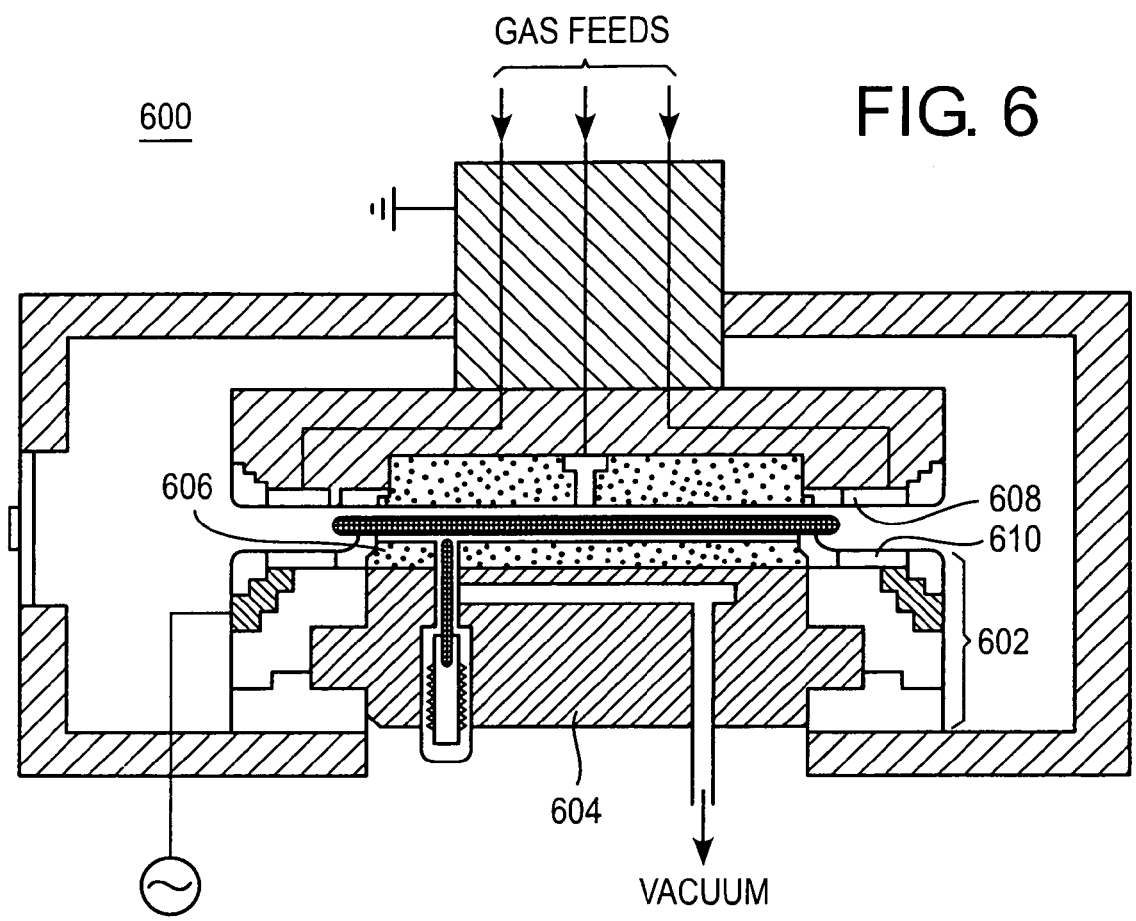
FIG. 6 shows a schematic cross sectional diagram of a bevel etcher in accordance with yet another embodiment.

FIG. 6 shows a schematic cross sectional diagram of a bevel etcher 600 in accordance with yet another embodiment. The components of the bevel etcher 600 are similar to those shown in FIGS. 5A and 5B. The difference is that the lower electrode assembly 602 includes a lower support 604 formed of a metal and the upper surface of lower support 604 is covered with a dielectric coating or layer 606. In a variation, the upper electrode ring 608 is coupled to an RF power source while the lower electrode ring 610 is grounded.

FIG. 7 shows a schematic cross sectional diagram of a bevel etcher 700 in accordance with a further embodiment. As depicted, the components of the bevel etcher 700 are similar to those shown in FIG. 2, with the difference that an electrostatic chuck 702 is used in place of the vacuum chuck. The electrostatic chuck 702 is disposed on a powered electrode 710 and holds a substrate 712 in place during a bevel cleaning operation. Upper and lower electrode rings 704, 706 are grounded while the powered electrode 710 is coupled to an RF source 708 for supplying power to generate the plasma.

FIG. 8 shows a schematic cross sectional diagram of a bevel etcher 800 in accordance with another embodiment. As depicted, the components of the bevel etcher 800 are similar to those in FIG. 7, i.e., an electrostatic chuck 802 is used to hold a substrate 812 in place during a bevel cleaning operation. The difference is that the upper electrode ring 804 is grounded while the lower electrode ring 806 is coupled to an RF power source 808 for supplying RF power to generate the plasma. In a variation, the upper electrode ring 804 is coupled to an RF power source while the lower electrode 806 is grounded.

Figure 9:
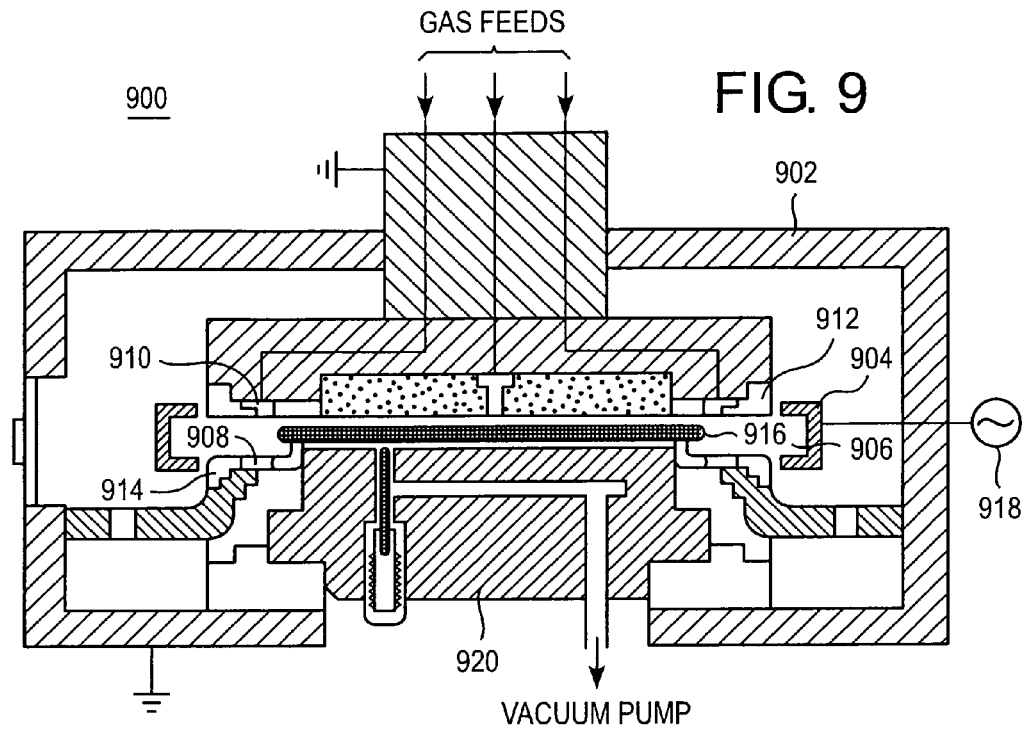
FIG. 9 shows a schematic cross sectional diagram of a bevel etcher in accordance with a yet further embodiment.

FIG. 9 shows a schematic cross sectional diagram of a bevel etcher 900 in accordance with yet a further embodiment. The components in the etcher 900 are similar to those shown in FIG. 2. The difference is that, in this embodiment, a hollow cathode ring 904, which is made of a conductive material, such as aluminum, is located outside the outer upper and lower dielectric rings 912, 914. The hollow cathode ring 904 has a channel 906 that faces the bevel edge. It is noted that the hollow cathode ring 904 is moved in a vertical direction during loading/unloading a substrate 916 by a suitable device (not shown in FIG. 9).

The hollow cathode ring 904 is coupled to an RF power source 918 and both lower and upper electrode rings 908, 910 are grounded. The RF power source supplies RF power in a frequency range from ~2 MHz to ~13 MHz, for instance. In a variation, the upper electrode ring 910 is coupled to an RF power source while the lower electrode ring 908 and the hollow cathode ring 904 are grounded. In another variation, the lower electrode ring 908 is coupled to an RF power source while the upper electrode ring 910 and the hollow cathode ring 904 are grounded. In yet another variation, the hollow cathode ring 904 is also coupled to a high-frequency RF power source to generate plasma for cleaning the interior of the chamber 902 and the top surface of the vacuum chuck 920, wherein the high-frequency RF power source provides RF power in the range from ~27 MHz to ~60 MHz, for instance.

Figure 10:
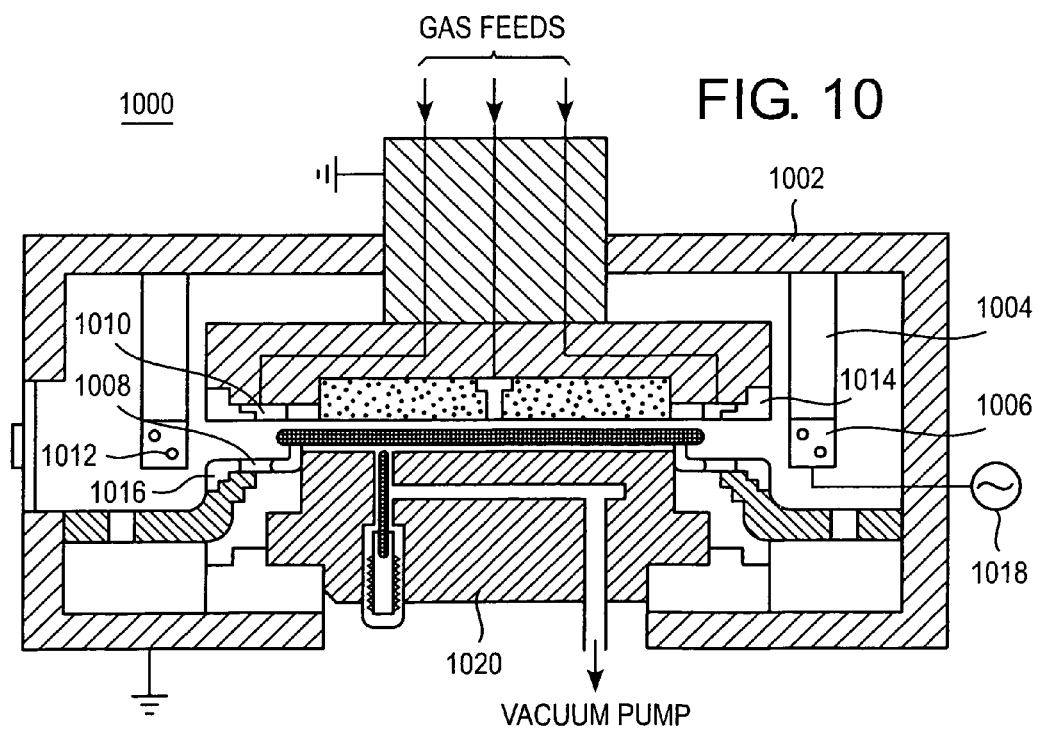
FIG. 10 shows a schematic cross sectional diagram of a bevel etcher in accordance with a still further embodiment.

FIG. 10 shows a schematic cross sectional diagram of a bevel etcher in accordance with a further embodiment. The components of the bevel etcher 1000 are similar to those shown in FIG. 2. The difference is that an inductive coil(s) 1006 surrounds the substrate edge and the space between the outer lower dielectric ring 1016 and the outer upper dielectric ring 1014. The inductive coil(s) 1012 is embedded in a dielectric material 1006 that is coupled to a dielectric support 1004. The dielectric support 1004 includes a suitable mechanism (not shown in FIG. 10) for moving the inductive coil 1012 in a vertical direction during loading/unloading a substrate.

The inductive coil 1012 is coupled to an RF power source 1018. During the bevel edge cleaning process, the RF power source 1018 supplies RF power in a range, but not limited to, of ~2 MHz to ~13 MHz to generate an inductively coupled plasma near the substrate edge. The upper electrode ring 1010 and the lower electrode ring 1008 are grounded to provide a return path for the inductive plasma. The inductive coil 1012 provides cleaning plasma to clean the bevel edge. In a variation, the inductive coil 1012 is also coupled to a high-frequency RF power source to generate plasma for cleaning the interior of the chamber 1002 and the top surface of the vacuum chuck 1020, wherein the high-frequency RF power source provides RF power in the range of ~27 MHz to ~60 MHz, for instance.

It is noted that the embodiments in FIGS. 2 and 6-10 have a center gas feed and edge gas feeds. However, the number of gas feeds may be varied to achieve a desired distribution of gas to the substrate and/or vicinity of the bevel edge. Also, the upper dielectric plate may have any suitable number and disposition of holes.

Figure 11A:
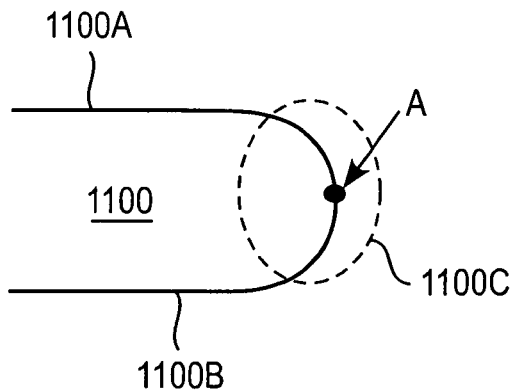
FIGS. 11A-11E illustrate various cleaning profiles for a partial cross-sectional view of a semiconductor substrate.

FIG. 11A illustrates a partial cross-sectional view of semiconductor substrate 1100, which includes top surface 1100A, backside surface 1100B and bevel edge 1100C (indicated by the dashed circle). Bevel edge also includes apex A (indicated by the arrow).

Figure 11B:
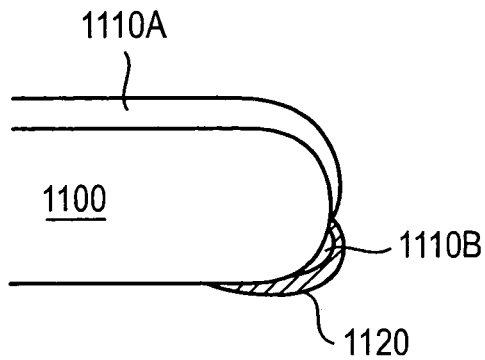

FIG. 11B illustrates an exemplary partial cross-sectional view of semiconductor substrate 1100, including wraparound layer 1110A, such as ultra low-k interlayer dielectric layer (ILD) overlying top surface 1100A and bevel edge 1100C, including apex A. For example, layer 1110 can be deposited by chemical vapor deposition or a suitable spin-on technique. Layer 1110 can also be subjected to previous plasma etching steps to form openings such as vias or trenches in the layer 1110 (not shown in FIG. 11A). In one embodiment, layer 1110 can be an interlayer dielectric material. Additionally, the bevel edge 1100C can include unetched deposits 1100B of layer 1100A or plasma etch byproducts 1120, such as polymer deposits. The layer 1100 is not etched of the inwardly from the bevel edge 1100C.

Exemplary interlayer dielectric materials for layer 1100 can include $SiO_2$/siloxane derivatives such as fluorine- and carbon-doped organosilicate glass (OSG) oxides, such as FLOWFILL® (manufactured by Trikon), BLACK DIAMOND® (manufactured by Applied Materials), CORAL® (manufactured by Novellus), AURORA® (manufactured by ASMI), organic polymers, such as JSR® (manufactured by JSR) and SiLK® (manufactured by Dow Chemical), or mesoporous glass and/or nanoporous glass, engineered with porogens which form pores in the dielectric material to enhance the low-k characteristics. Higher dielectric constant materials (k=3.8-4.0) can also be used, including borophosphosilicate glass (BPSG) and tetraethylorthosilicate (TEOS). For example, layer 1110 can be a single layer or multiple layers of low-k dielectric and/or photoresist materials.

Figure 11C:
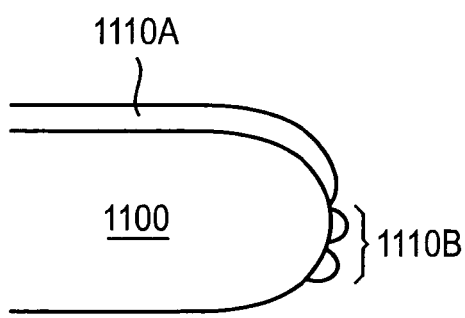
Figure 11D:
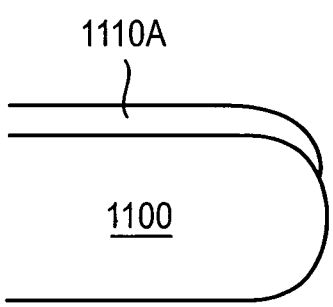
Figure 11E:
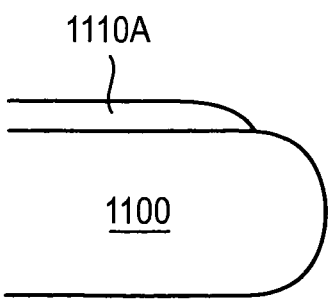

FIGS. 11C-11E illustrate cross-sectional etching profiles for various stages of completion for bevel cleaning of substrate 1100. FIG. 11C illustrates the cross-sectional etching profile for incomplete bevel cleaning. If bevel cleaning is terminated prematurely, this incomplete etching of 1110A along bevel edge 1100C can be problematic due to peeling or flaking of remnants of layer 1110B, along bevel edge 1100C. As a result, this peeling or flaking can be a potential source of particulate contamination, which can decrease the process yield of semiconductor devices formed on substrate 1100.

FIG. 11D illustrates the cross-sectional cleaning profile in which the bevel edge 1100C has been partially cleaned. For a partially cleaned profile, layer 1110A overlying apex A has been removed, however, a portion of layer 1110A partially covers the bevel edge 1100C above apex A. For instance, the partial bevel clean can remove deposited material on the lower 60% to 90% of the bevel edge 1100C and leave some of the ILD on the top 10% to 40% of the bevel edge 1100C.

FIG. 11E illustrates the cross-sectional etching profile in which the bevel edge 1100C has been completely cleaned. For this profile, the portions of layer 1110 overlying the bevel edge 1100C are completely removed.

Although the FIG. 11E cross-sectional cleaning profile has been previously considered optimal, it has been determined that the partial coverage of bevel edge 1100C with overlying layer 1110A (FIG. 11D) results in an increase in process yield gain of up to 5% relative to the situation when bevel edge has been completely cleaned. It is believed that the partial coverage of bevel edge 1100C creates a more robust structure, during subsequent substrate processing (e.g., chemical mechanical polishing).

The degree of bevel edge cleaning can be controlled by using different configurations of upper PEZ ring 302. As illustrated in FIG. 4A, one parameter of upper PEZ ring 302 includes an outer diameter on a lower portion 302a closest to the substrate 218. Testing was performed to determine the effect of varying outer diameter on a lower portion 302a of upper PEZ ring 302 on the cleaning profile of the bevel edge.

Example 1

A first set of experiments was performed in a 2300 CORONUS™ plasma-based bevel cleaning system (available from Lam Research Corporation, Fremont, Calif.) to determine the bevel cleaning profile for a first upper PEZ ring configuration. In one configuration, an upper PEZ ring 302 (i.e., FIG. 4A) with $D_1$ from greater than 0 to 2 mm, was installed for cleaning a 300 mm substrate wafer. This configuration results in an outer diameter on a lower portion of upper PEZ of 296 mm to less than 300 mm (i.e. the upper PEZ ring has an outer diameter less than the substrate diameter). Before cleaning, the silicon substrate was thermally treated to form an overlying silicon oxide film.

Figure 12A:
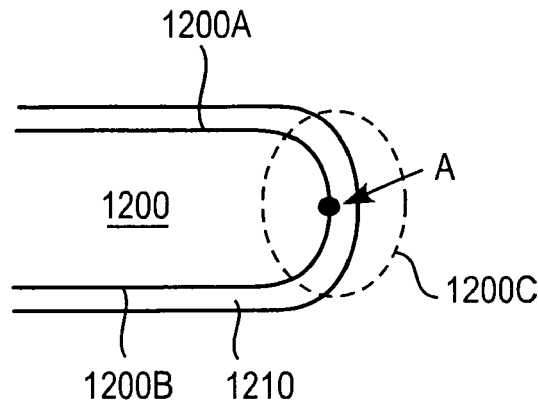
FIGS. 12A-12C illustrate cleaning profiles for a partial cross-sectional view of a semiconductor substrate using an upper PEZ ring with the outer diameter of a lower portion less than the outer diameter of the substrate.

FIG. 12A illustrates a partial cross-sectional view of silicon substrate 1200 with overlying silicon oxide layer 1210 before bevel cleaning. Silicon substrate 1200 includes top surface 1200A, backside surface 1200B, bevel edge 1200C (as indicated by the dashed circle) and apex A. Silicon oxide layer 1210 covers top surface 1200A, backside surface 1200B and wraps around bevel edge 1200C. A process gas was introduced into the reaction chamber of the bevel cleaning system, which was energized with RF power to clean the bevel edge with the plasma. For example, the process gas was a fluorine-containing gas (e.g., $CF_4$, $SF_6$, $NF_3$ or $C_2F_6$) at a flow rate of about 10 SCCM to about 100 SCCM. The balance of the process gas was $CO_2$, $O_2$ and/or $N_2$ with a total flow rate of about 200 SCCM to about 500 SCCM. The chamber pressure was from about 0.5 Torr to about 2 Torr. The RF power was from about 400 W to about 800 W.

Figure 12B:
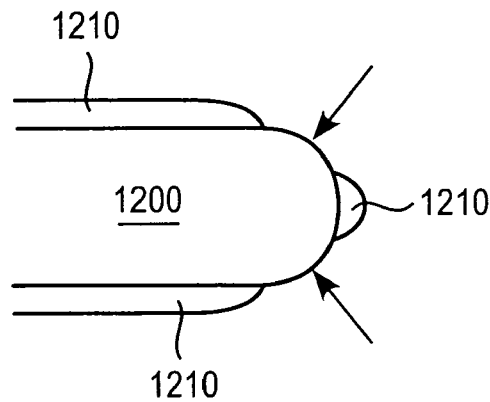

FIG. 12B illustrates a partial cross-sectional view of silicon substrate 1200 after the bevel cleaning has been partially completed. As illustrated in FIG. 12B, top and bottom portions of bevel edge 1200C (indicated by the arrows) were the first regions of silicon substrate 1200 to be exposed. Thus, based on this cleaning profile, it has been determined that the etch rate maximum occurs at positions on the silicon substrate 1210 covering the top and bottom portions of bevel edge 1200C. Remnants of silicon oxide layer 1210 cover apex A of bevel edge 1200C.

Figure 12C:
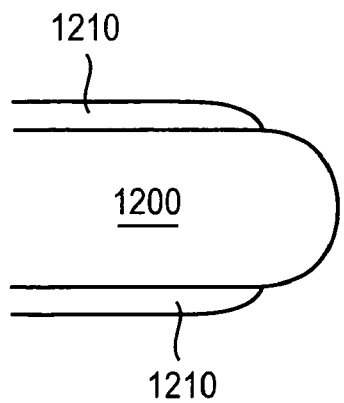

FIG. 12C illustrates a partial cross-sectional view of silicon substrate 1200 after the bevel cleaning has been completed. Silicon oxide layer 1210 has been completely removed from bevel edge 1200C. Thus, an upper PEZ ring 302 in which $D_1$ is greater than 0 to 2 mm for an outer diameter on a lower portion of the upper PEZ ring of 296 mm to less than 300 mm is a preferred configuration for achieving a bevel etch with a completely etched profile (i.e., FIG. 11E).

Example 2

A second set of experiments was performed in a 2300 CORONUS™ plasma-based bevel cleaning system to determine the bevel cleaning profile of a second upper PEZ ring configuration. In a second embodiment, an upper PEZ ring 302 with a negative $D_1$ value of 0.25 mm to 1.25 mm was installed for cleaning a 300 mm substrate wafer. This configuration results an outer diameter on a lower portion of the upper PEZ ring from 300.5 mm to 302.5 mm (i.e. the outer diameter of a lower portion of the upper PEZ ring is greater than the substrate diameter). Before cleaning, the silicon substrate coated with a tetraethylorthosilicate (TEOS or $Si(OC_2H_5)_4$) film. A process gas was introduced into the reaction chamber of the bevel cleaning system, which was energized with RF power to clean the bevel edge with the plasma. For example, the process gas was a fluorine-containing gas (e.g., $CF_4$, $SF_6$, $NF_3$ or $C_2F_6$) at a flow rate of about 10 SCCM to about 100 SCCM. The balance of the process gas was $CO_2$, $O_2$ and/or $N_2$ with a total flow rate of about 200 SCCM to about 500 SCCM. The chamber pressure was from about 0.5 Torr to about 2 Torr. The RF power was from about 400 W to about 800 W.

Figure 13A:
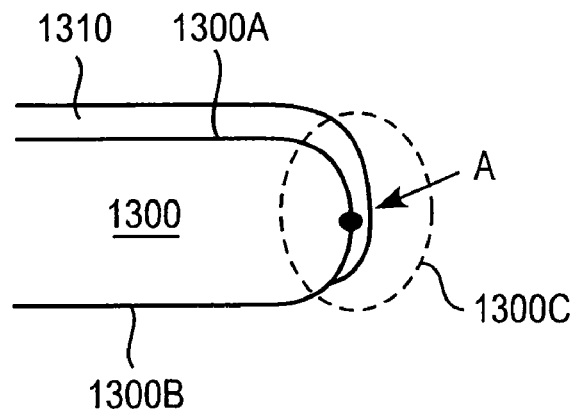
FIGS. 13A-13C illustrate cleaning profiles for a partial cross-sectional view of a semiconductor substrate using an upper PEZ ring with the outer diameter of a lower portion greater than the outer diameter of the substrate.

FIG. 13A illustrates a partial cross-sectional view of silicon substrate 1300 with overlying TEOS layer 1310 before bevel cleaning. Silicon substrate 1300 includes top surface 1300A, backside surface 1300B, bevel edge 1300C (as indicated by the dashed circle) and apex A. TEOS layer 1310 covers top surface 1300A and wraps around a portion of bevel edge 1200C, covering apex A.

Figure 13B:
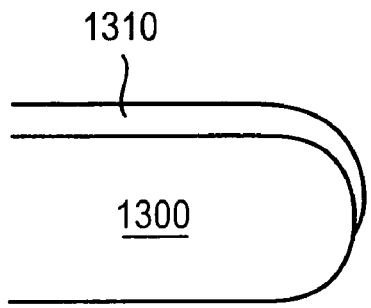

FIG. 13B illustrates a partial cross-sectional view of silicon substrate 1300 after the bevel cleaning has been partially completed. As illustrated in FIG. 13B, portions of the TEOS layer 1310 covering apex A have been removed. Thus, based on this cleaning profile, it has been determined that the etch rate maximum occurs at the apex A of bevel edge 1300C.

Figure 13C:
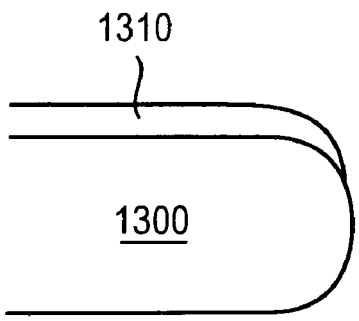

FIG. 13C illustrates a partial cross-sectional view of silicon substrate 1300 after the bevel cleaning has been completed. Although TEOS layer 1310 has been completely removed from the apex A of bevel edge 1300C, TEOS 1310 partially wraps around the upper portion of the bevel edge 1300C. As described above, in connection with FIG. 11D, the FIG. 13C etch profile results in an increase in process yield gain of up to 5% relative to the situation when bevel edge has been completely cleaned (e.g., FIG. 12C or FIG. 11E). Thus, an upper PEZ ring 302 with a negative $D_1$ value of 0.25 mm to 1.25 for an outer diameter on a lower portion upper PEZ of 300.5 mm to 302.5 mm is a preferred configuration for achieving a partially cleaned profile (i.e., FIG. 13 C or FIG. 11D).

In another embodiment, depending upon the degree of bevel edge cleaning, the upper PEZ ring radius can range from having the same diameter as the substrate to being up to 10% larger than the diameter of the substrate, (e.g., 0.5 mm to 5 mm larger in diameter or any value in between, in increments of 0.1 mm).

Figure 14:
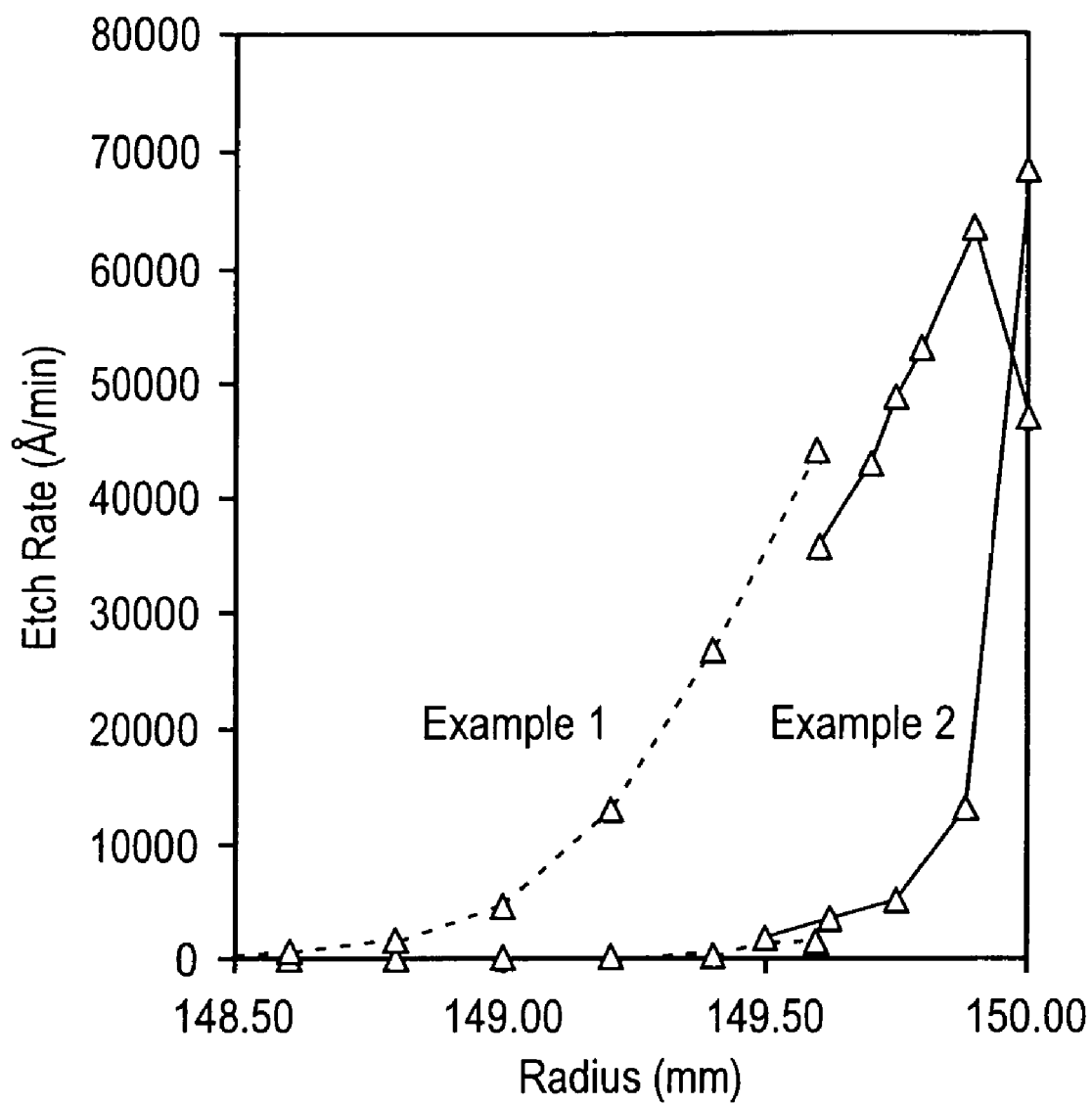
FIG. 14 illustrates a graph of etch rate as a function of radial position on a substrate using an upper PEZ ring with the outer diameter on a lower portion less than the outer diameter; and an upper PEZ ring with the outer diameter on a lower portion greater than the outer diameter of the substrate.

FIG. 14 provides a comparison for etching rate as a function of radial position for: (1) an outer diameter on a lower portion of an upper PEZ ring of 296 mm to less than 300 mm (less than the diameter of the substrate) (Example 1); and (2) an outer diameter on a lower portion of an upper PEZ ring of 300.5 mm to 302.5 mm (greater than the diameter of the substrate) (Example 2). As illustrated in FIG. 14, for Example 1, the maximum etch rate occurs at radial position of about 149.8 mm. However, for Example 2, the maximum etch rate occurs at radial position of about 150 mm. Etch rate was determined by measuring the thickness of an overlying layer by dual beam spectrometry (DBS) and spectroscopic ellipsometry (SE) to measure film properties, such as thickness and refractive index, of layers present on a semiconductor substrate (KLA TENCOR Model F5X, manufactured by KLA Tencor, located in San Jose, Calif.). However, because this technique is limited to characterizing a substrate radius of up to 149.5 mm, the remaining outmost 0.5 mm of the substrate was characterized by scanning electron microscopy (SEM). FIG. 14 illustrates that to maximize an etch rate at the apex of the substrate (i.e., a radial position of 150 mm), a bevel etcher can be configured with an upper PEZ ring 302, having a negative $D_1$ value of 0.25 mm to 1.25 mm.

FIG. 14 also illustrates that the Example 2 embodiment has the ability to achieve differential cleaning rates as a function of radial position along substrate 1300, with a maximum etch rate at the apex A of bevel edge 1300C. From Example 2 of FIG. 14, the etching rate near the apex A (about 7,000 Å/minute at a radius at 150 mm) of the bevel edge is greater than the etch rate along the upper portion of the bevel edge (<2,000 Å/minute at a radius of about 149.8 mm).

The preferred embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of cleaning a bevel edge of a semiconductor substrate, comprising:
   placing a semiconductor substrate on a substrate support in a reaction chamber of a plasma processing apparatus, the substrate having a dielectric layer overlying a top surface and a bevel edge of the substrate, the layer extending above and below an apex of the bevel edge;
   introducing a process gas into the reaction chamber;
   energizing the process gas into a plasma; and
   cleaning the bevel edge with the plasma so as to remove the layer below the apex without removing all of the layer above the apex;
   wherein the layer is not etched at portions of the top surface of the substrate extending inwardly from the bevel edge.

2. The method of claim 1, wherein cleaning the bevel edge with the plasma further comprises etching the layer with a higher etch rate at the apex than inwardly of the apex along the upper portion of the bevel edge.

3. The method of claim 1, wherein the layer is an interlayer dielectric; and the plasma processing apparatus is a bevel etcher.

4. The method of claim 1, wherein the process gas comprises an oxygen-based gas selected from $O_2$ and $CO_2$.

5. The method of claim 4, wherein the process gas further comprises a fluorine-based gas.

6. The method of claim 5, wherein the fluorine-based gas includes $CF_4$, $SF_6$, $NF_3$ or $C_2F_6$.

7. The method of claim 1, wherein the cleaning removes etch byproducts on the bevel edge and/or on a backside of the substrate.

8. The method of claim 1, wherein the substrate is a semiconductor wafer and the cleaning is carried out with a bevel etch plasma processing apparatus, wherein a portion of an upper plasma exclusion zone ring closest to the wafer has an outer diameter equal to or greater than an outer diameter of the wafer.

9. The method of claim 1, wherein the substrate is a 300 mm diameter silicon wafer.

10. The method of claim 1, wherein the layer is a low-k or high-k dielectric layer.

11. The method of claim 1, wherein the layer is silicon oxide, organosilicate glass (OSG), fluorinated silica glass (FSG), carbon-doped oxide, mesoporous and/or nanoporous glass, organic polymer, borophosphosilicate glass (BPSG) or tetraethylorthosilicate (TEOS).

* * * * *